United States Patent
Gong et al.

(10) Patent No.: US 11,264,436 B2
(45) Date of Patent: Mar. 1, 2022

(54) DISPLAY SUBSTRATE, MANUFACTURING METHOD THEREFOR, DISPLAY PANEL AND DISPLAY DEVICE

(71) Applicants: BOE Technology Group Co., Ltd., Beijing (CN); Hefei BOE Optoelectronics Technology Co., Ltd., Anhui (CN)

(72) Inventors: Kui Gong, Beijing (CN); Qingli Feng, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 744 days.

(21) Appl. No.: 16/082,385

(22) PCT Filed: Jan. 9, 2018

(86) PCT No.: PCT/CN2018/071879
§ 371 (c)(1),
(2) Date: Sep. 5, 2018

(87) PCT Pub. No.: WO2019/019564
PCT Pub. Date: Jan. 31, 2019

(65) Prior Publication Data
US 2021/0225963 A1 Jul. 22, 2021

(30) Foreign Application Priority Data
Jul. 27, 2017 (CN) .......................... 201710624281.1

(51) Int. Cl.
*H01L 27/32* (2006.01)
*G02F 1/1339* (2006.01)
(Continued)

(52) U.S. Cl.
CPC ........ *H01L 27/3232* (2013.01); *G02F 1/0126* (2013.01); *G02F 1/13394* (2013.01);
(Continued)

(58) Field of Classification Search
CPC . H01L 27/3232; H01L 51/56; H01L 27/3246; H01L 2227/323; G02F 1/13394; G02F 1/13398; G02F 1/0126
See application file for complete search history.

(56) References Cited

U.S. PATENT DOCUMENTS 9,349,957 B2  5/2016  Shin et al.
2001/0012079 A1  8/2001  Yamamoto et al.
(Continued)

FOREIGN PATENT DOCUMENTS

CN  101581852 A  11/2009
CN  101764145 A  6/2010
(Continued)

OTHER PUBLICATIONS

Jun. 10, 2019—(CN) First Office Action Appn 201710624281.1 with English Translation.
(Continued)

*Primary Examiner* — Edward Chin
(74) *Attorney, Agent, or Firm* — Banner & Witcoff, Ltd.

(57) ABSTRACT

A display substrate, a manufacturing method thereof, a display panel and a display device are provided. The display substrate includes: a base substrate, a plurality of display areas arranged in an array on the base substrate, and non-display areas between the display areas. A display structure is disposed in the display area and configured to display images. The non-display area is light-transparent and is provided with a photochromic pattern. The photochromic
(Continued)

pattern is configured to adjust the light transmittance of the non-display area according to the illumination intensity of the received light.

15 Claims, 5 Drawing Sheets

(51) Int. Cl.
    *G02F 1/01*     (2006.01)
    *H01L 51/56*     (2006.01)

(52) U.S. Cl.
    CPC ...... *G02F 1/13398* (2021.01); *H01L 27/3246* (2013.01); *H01L 51/56* (2013.01); *H01L 2227/323* (2013.01)

(56) References Cited

U.S. PATENT DOCUMENTS

2010/0156765 A1*   6/2010  Park .................. H01L 27/3232
                                                                   345/77

2016/0104752 A1   4/2016  Oh et al.
2016/0226030 A1*   8/2016  Heo .................. H01L 51/5284
2017/0178595 A1   6/2017  Kim et al.

FOREIGN PATENT DOCUMENTS

| | | |
|---|---|---|
| CN | 102737576 A | 10/2012 |
| CN | 102832353 A | 12/2012 |
| CN | 104218182 A | 12/2014 |
| CN | 105467663 A | 4/2016 |
| CN | 106601768 A | 4/2017 |
| CN | 107452779 A | 12/2017 |
| JP | 2017116767 A | 6/2017 |

OTHER PUBLICATIONS

Apr. 20, 2018—(WO) International Search Report and the Written Opinion Appn PCT/CN2018/071879 with English Translation.

* cited by examiner

DISPLAY SUBSTRATE, MANUFACTURING METHOD THEREFOR, DISPLAY PANEL AND DISPLAY DEVICE

CROSS REFERENCE TO RELATED APPLICATIONS

The application is a U.S. National Phase Entry of International Application No. PCT/CN2018/071879 filed on Jan. 9, 2018, designating the United States of America and claiming priority to Chinese Patent Application No. 201710624281.1, filed on Jul. 27, 2017. The present application claims priority to and the benefit of the above-identified applications and the above-identified applications are incorporated by reference herein in their entirety.

TECHNICAL FIELD

Embodiments of the present disclosure relate to a display substrate, a manufacturing method therefor, a display panel and a display device.

BACKGROUND

Transparent display technology refers to a display technology in which the images displayed on a display panel can be viewed and a real scene behind the display panel can also be viewed. It is widely applied in windows, exhibition booth, vehicle windows, etc.

A transparent display panel usually includes a plurality of display areas arranged in an array and non-display areas disposed between the display areas. The display areas are used for image display, and the non-display areas are used for light transmission. A user can view display images provided on the display panel through light emitted from the display areas, meanwhile, the user can also observe a real scene behind the display panel through light transmitted from the non-display areas.

SUMMARY

At least one embodiment of the present disclosure provides a display substrate, comprising: a base substrate, a plurality of display areas arranged in an array on the base substrate, and non-display areas between the display areas. A display structure is disposed in each display area and configured to display images; and a photochromic pattern is disposed in the non-display areas and configured to adjust a light transmittance of the non-display areas according to an illumination intensity of received light.

For example, the display substrate is an organic light-emitting diode (OLED) display substrate; the display structure includes an OLED; and the OLED includes: an anode electrode, a cathode electrode and an organic functional layer disposed between the anode electrode and the cathode electrode.

For example, a pixel definition layer (PDL) is disposed in the non-display areas; the PDL defines the display areas; and the photochromic pattern is on a side of the PDL away from the base substrate.

For example, an orthographic projection of the photochromic pattern on the PDL just covers a surface of a side of the PDL facing the photochromic pattern.

For example, the display substrate is a liquid crystal display (LCD) substrate; and the display structure includes a pixel electrode.

For example, material of the photochromic pattern includes: at least one of silver halide, zinc halide, cadmium halide, copper halide, magnesium halide, spiropyran, phenoxazine dye, diarylethene derivatives, dehydropyridine, furazolidic anhydride derivatives, or azobenzene derivatives.

Embodiments of the present disclosure also provide a display panel, comprising any of the display substrates.

Embodiments of the present disclosure also provide a display device, comprising the display panel.

At least one embodiment of the present disclosure also provides a method for manufacturing a display substrate, the display substrate including a plurality of display areas arranged in an array and non-display areas between the display areas. The method for manufacturing the display substrate comprises: forming a display structure in corresponding display areas on the base substrate, in which the display structure is used for image display; and forming a photochromic pattern in corresponding non-display areas on the base substrate, in which the photochromic pattern is configured to adjust a light transmittance of the non-display areas according to an illumination intensity of received light.

For example, the display substrate is an OLED display substrate; and forming of the display structure and forming of the photochromic pattern include: forming a thin-film transistor (TFT) on the base substrate; forming a planarization layer on a side of the TFT away from the base substrate; forming an anode electrode on a side of the planarization layer away from the base substrate, in which the anode electrode is connected with a drain electrode of the TFT via a through hole; forming a pixel definition layer (PDL) on the side of the planarization layer away from the base substrate, in which the PDL is in the non-display areas and configured to define the display areas; forming the photochromic pattern on a side of the PDL away from the base substrate; forming an organic functional layer on a side of an anode electrode away from the base substrate, in which the organic functional layer is disposed in the display areas; and forming a cathode electrode on a side of the organic functional layer away from the base substrate.

For example, forming of the PDL and forming of the photochromic pattern include: forming a pixel definition material film on a side of the planarization layer away from the base substrate; forming a photochromic material film on a side of the pixel definition material film away from the base substrate; and patterning the pixel definition material film and the photochromic material film to obtain the PDL and the photochromic pattern.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

The inventor noticed that: in actual application, when the external environment is brighter, the brightness of light transmitted from the non-display areas is high; and in this case, the brightness of areas on the display panel, where darker images are originally displayed, is increased, and the contrast of the display panel is reduced. In addition, the human eyes can be easily damaged when the light with high brightness, transmitted from the non-display areas, directly hits the human eyes.

Figure 1:
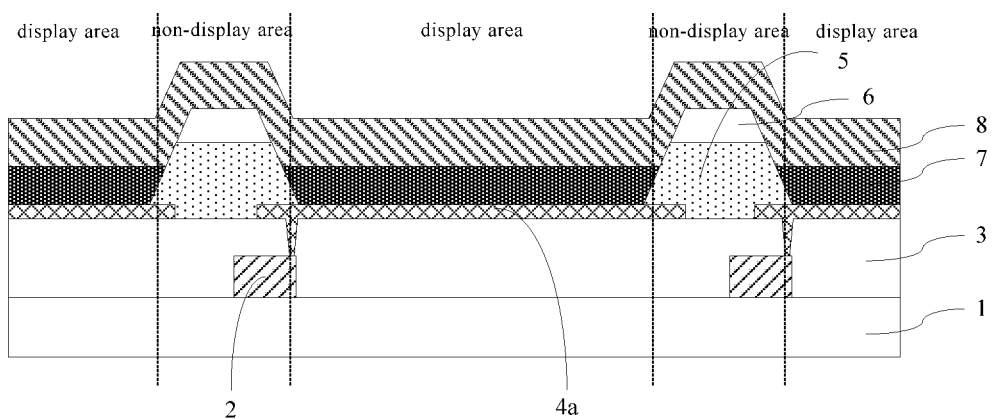
FIG. 1 is a schematically sectional view of a display substrate provided by a first embodiment of the present disclosure.
Figure 2:
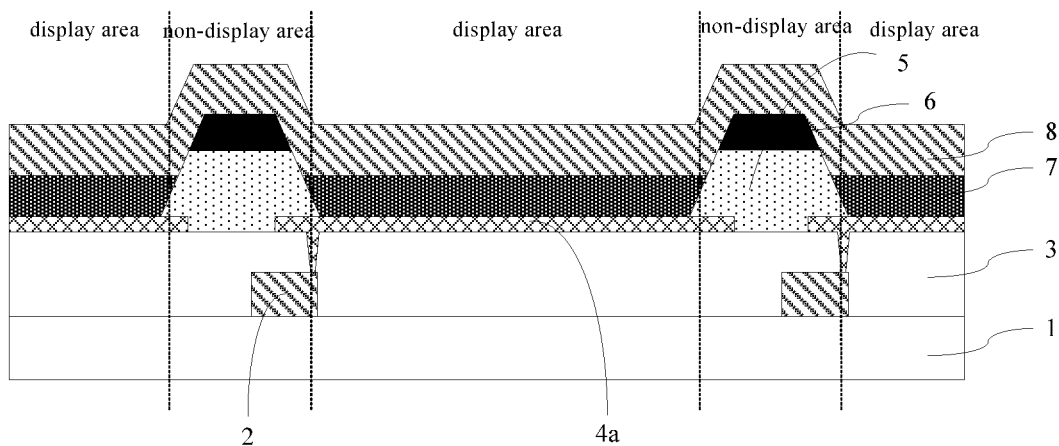
FIG. 2 is a schematically diagram illustrating the situation when photochromic pattern in FIG. 1 is in colored state.

FIG. 1 is a schematically sectional view of a display substrate provided by the first embodiment of the present disclosure. FIG. 2 is a schematic diagram illustrating the situation when the photochromic pattern in FIG. 1 is in colored state. As illustrated in FIGS. 1 and 2, the display substrate comprises: a plurality of display areas arranged in an array and non-display areas disposed between the display areas. A display structure is disposed in the display area and used for image display. The non-display area is light-transparent and is provided with a photochromic pattern 6. The photochromic pattern 6 is configured to adjust the light transmittance of the non-display areas according to the illumination intensity of received light.

It is noted that the photochromic pattern 6 in the present disclosure includes photochromic material, and the photochromic material refers to a type of material that can undergo color change after being excited by a light source. In the embodiment of the present disclosure, when the photochromic pattern 6 is irradiated by light with low light intensity or not irradiated by light, the photochromic pattern 6 is transparent; when the photochromic pattern 6 is irradiated by light with certain light intensity, the photochromic pattern 6 is colored, and with the increasing of the light intensity of the light, the light transmittance of the photochromic pattern 6 is gradually decreased.

The photochromic material in the embodiment may be inorganic photochromic material or organic photochromic material. For instance, the inorganic photochromic material includes at least one of silver halide, zinc halide, cadmium halide, copper halide or magnesium halide; and the organic photochromic material includes at least one of spiropyran, phenoxazine dye, diarylethene derivatives, dehydropyridine, furazolidic anhydride derivatives, or azobenzene derivatives.

In actual application, the material of the photochromic pattern 6 in the application may be obtained by doping photochromic material into matrix material (e.g., silica, organic resins), and the doping amount of the photochromic material in the matrix material is 0.01 wt %-15 wt %.

For example, for silver halide, a photochromic film can be prepared by doping silver halide crystal particles into a silicon dioxide film or organic resins, and the doping amount of the photochromic material is 0.01 wt %-15 wt %. The doping method is not limited. For example, for the doping of the silicon dioxide film, the silver halide crystal particles may be doped into silicon dioxide target material in a certain portion, then, the photochromic film for forming the photochromic pattern 6 is prepared by a magnetron sputtering process.

For example, the principle of the photochromic film is described by referring to silver halide again: in a film containing silver halide crystals, the silver halide decomposes silver and halogen atoms when exposed to light; silver is a colloidal molecular chain and is colored and darkened by uniform light adsorption produced by a transparent film in a visible area, and correspondingly, the light transmittance of the photochromic film is reduced; the halogen atoms cannot escape or be adsorbed due to the impermeability of the film body, so electrons captured by the silver atoms under the excitation of light energy with longer wavelength will be released to the halogen atoms to form silver ions and halogen ions after stopping illumination, namely becoming the silver halide, and correspondingly, the light transmittance of the photochromic film is improved. The decomposition reaction and synthesis reaction of the silver halide are reversible.

In the embodiment, the factors that affect the light transmittance of the photochromic pattern 6 include the brightness of the external environment and the luminance of the display areas.

Supposing that the luminous conditions of the display areas include three conditions: no light, dark light and bright light, the photochromic pattern 6 can be subjected to color change due to the intensity of light irradiated to surface of the photochromic pattern 6 in the case of bright light emitted by the display areas, and the photochromic pattern 6 cannot be subjected to color change due to the intensity of light irradiated to the surface of the photochromic pattern 6 in the case of no light or dark light emitted by the display areas.

Detailed description will be given below to different working states of the display substrate provided by the embodiment with reference to FIGS. 1 and 2.

When the external environment is dark and the display areas do not emit light, the illumination intensity of the surface of the photochromic pattern 6 is low, and the light of the external environment is not enough to excite the color change of the photochromic pattern 6, in this case, the photochromic pattern 6 is transparent, and the light transmittance of the non-display areas is the maximum. In this case, the display device comprising the display substrate provided by the embodiment may be used as a transparent ornament.

When the external environment is dark and the display areas emit dark light, the illumination intensity of the surface of the photochromic pattern 6 is low, and the light of the external environment and the light produced by the display areas are not enough to excite the color change of the photochromic pattern 6. In this case, the photochromic pattern 6 is transparent, and the light transmittance of the non-display areas is the maximum. In this case, the display device comprising the display substrate provided by the embodiment may be used as a transparent display device.

When the external environment is dark and the display areas emit bright light, the illumination intensity of the surface of the photochromic pattern 6 is high, and the light of the external environment is not enough to excite the color change of the photochromic pattern 6, but the light produced by the display areas can excite the color change of the photochromic pattern 6. In this case, the photochromic pattern 6 is in colored state; and along with the increasement of the luminance of the display areas, the light transmittance of the non-display areas is correspondingly reduced. In this case, the display device comprising the display substrate provided by the embodiment may be used as a semitransparent display device.

When the external environment is bright and the display areas do not emit light, the illumination intensity of the surface of the photochromic pattern 6 is high, and the light of the external environment can excite the color change of the photochromic pattern 6. In this case, the photochromic pattern 6 is in colored state; and along with the increasement of the brightness of the external environment, the light transmittance of the non-display areas is correspondingly reduced. In this case, the display device comprising the display substrate provided by the embodiment may be used as sunglasses.

When the external environment is bright and the display areas emit dark light, the illumination intensity of the surface of the photochromic pattern 6 is high, and the light of the external environment can excite the color change of the photochromic pattern 6. In this case, the photochromic pattern 6 is in colored state; and along with the increasement of the brightness of the external environment, the light transmittance of the non-display areas is correspondingly reduced. In this case, the brightness of the side of the non-display area facing the human eyes of the user is low, and the brightness of areas on a display image, where darker images are originally displayed, will not be increased due to the effect of ambient light. In this way, the contrast of the display image can be effectively guaranteed, and the display quality can be improved. Meanwhile, the brightness of the ambient light is significantly decreased after the light is filtered by the photochromic pattern 6 in colored state, so the damage to the human eyes can be avoided. In this case, the display device comprising the display substrate provided by the embodiment may be used as a non-transparent display device (the light transmittance of the non-display areas is 0) or a semi-transparent display device (the light transmittance of the non-display area is greater than 0).

When the external environment is bright and the display areas emit bright light, the illumination intensity of the surface of the photochromic pattern 6 is low, and both the light of the external environment and the light emitted from the display areas can excite the color change of the photochromic pattern 6. In this case, the photochromic pattern 6 is in colored state; and along with the increasement of the brightness of the external environment, the light transmittance of the non-display areas is correspondingly decreased. In this case, the brightness of the side of the non-display area facing the human eyes of the user is low, and the brightness of areas on a display image, where darker images are originally displayed, will not be increased due to the effect of the ambient light. In this way, the contrast of the display image can be effectively guaranteed, and the display quality can be improved. Meanwhile, the brightness of the ambient light is significantly decreased after the light is filtered by the photochromic pattern 6 in colored state, so the damage to the human eyes can be avoided. In this case, the display device comprising the display substrate provided by the embodiment may be used as a non-transparent display device or a semi-transparent display device.

When the display substrate provided by the embodiment of the present disclosure is in a high-brightness external environment, the brightness of areas on a display image, where darker images are originally displayed, will not be increased due to the effect of the ambient light. In this way, the contrast of the display image can be effectively guaranteed, and the display quality can be improved. Meanwhile, the brightness of the ambient light is significantly decreased after the light is filtered by the photochromic pattern 6 in colored state, so the damage to the human eyes can be avoided.

As shown in FIG. 1, as an example of the embodiment of the present disclosure, the display substrate is an organic light-emitting diode (OLED) display substrate; a pixel definition layer (PDL) 5 (made of photosensitive insulating organic resins) is disposed in the non-display area of the OLED display substrate; the PDL 5 define the display areas; OLEDs are disposed in the display areas; TFTs 2 are disposed in the non-display areas; each OLED includes: an anode electrode 4a, a cathode electrode 8 and an organic functional layer 7 disposed between the anode electrode 4a and the cathode electrode 8; and the anode electrode 4a is electrically connected with a drain electrode in the TFT 2. In the embodiment, the organic functional layer 7 refers to a layer structure capable of emitting light under the action of the electric field between the anode electrode 4a and the cathode electrode 8. The organic functional layer 7 at least includes an organic electroluminescent layer (made of electroluminescent materials). In order to improve the luminous efficiency of the OLED, the organic functional layer 7 may also include a hole injection layer (HIL), a hole transport layer (HTL), an electron blocking layer (EBL), a hole blocking layer (HBL), an electron transport layer (ETL), an electron injection layer (EIL) and other layers (all are not shown). In the embodiment, for instance, the photochromic pattern 6 is disposed on a side of the PDL 5 away from a base substrate 1, and an orthographic projection of the photochromic pattern 6 on the PDL 5 just covers a surface of a side of the PDL 5 facing the photochromic pattern 6, namely the shape of a lower surface of the photochromic pattern 6 is the same as the shape of an upper surface of the PDL 5. In this case, the effect of the photochromic pattern 6 in adjusting the light transmittance of the non-display area is optimum. In addition, the PDL 5 and the photochromic pattern 6 may be also simultaneously formed by a single patterning process, so no mask is required to be independently arranged for the forming of the photochromic pattern 6, and therefore the production cost is reduced.

It should be noted that: the case, in which the photochromic pattern 6 is disposed on the side of the PDL 5 away from the base substrate 1 and the orthographic projection of the photochromic pattern 6 on the PDL 5 just covers the surface of the side of the PDL 5 facing the photochromic pattern 6, is an example of the embodiment and will not limit the technical proposal of the embodiment of the present disclosure, and it should be understood by those skilled in the art that the photochromic pattern 6 in the embodiment may also be disposed between other layers, as long as the photochromic pattern 6 is disposed in the non-display area.

Figure 3:
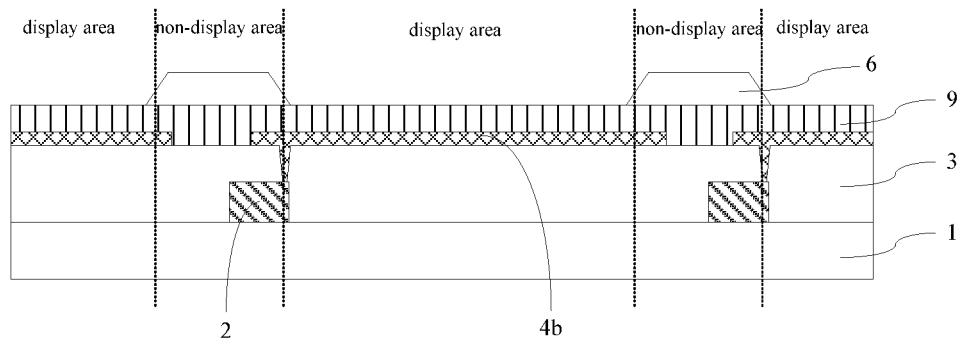
FIG. 3 is a schematically sectional view of a display substrate provided by a second embodiment of the present disclosure.

FIG. 3 is a schematically sectional view of a display substrate provided by the second embodiment of the present disclosure. As shown in FIG. 3, as different from the case that the display substrate in the first embodiment is an OLED display substrate, the display substrate in the embodiment is an LCD substrate; pixel electrodes 4b are disposed in display areas; TFTs 2 are disposed in non-display areas; each of the pixel electrodes 4b is connected with a drain electrode of the corresponding TFT 2; and an electric field may be formed between each of the pixel electrodes 4b and a common electrode disposed on the same substrate or an opposed substrate, so as to control display.

An insulating layer 9 arranged in the form of entire layer is disposed on the pixel electrodes 4b; a photochromic pattern 6 is disposed on a side of the insulating layer 9 away from the pixel electrodes 4b; and the photochromic pattern 6 is disposed in the non-display areas.

When the patterning preciseness is high enough, the insulating layer 9 may be omitted, so that the pixel electrodes 4b and the photochromic pattern 6 can be same-layer structures; the pixel electrodes 4b are disposed in the display areas; the photochromic pattern 6 is disposed in the non-display areas; and the pixel electrodes and the photochromic pattern are insulated from each other. This instance is not shown in corresponding accompanying drawing.

It should be understood by those skilled in the art that both the type of the display substrate and the layer position of the photochromic pattern 6 are not limited in the embodiment of the present disclosure, as long as the photochromic pattern 6 is disposed in the non-display areas.

The first embodiment and the second embodiment provide the display substrate; the photochromic pattern is disposed in the non-display areas of the display substrate; and the photochromic pattern can adjust the light transmittance of the non-display areas according to the illumination intensity of received light, so that the brightness of the areas on the display image, where the darker images are originally displayed, will not be increased due to the effect of the ambient light. In this way, the contrast of the display area can be effectively guaranteed, and the display quality can be improved. Meanwhile, the brightness of the ambient light is significantly decreased after the light is filtered by the photochromic pattern in colored state, so the damage to the human eyes can be avoided.

The third embodiment of the present disclosure provides a display panel. The display panel employs the display substrate provided by the first embodiment or the second embodiment. The specific content may refer to the description in the first embodiment or the second embodiment. No further description will be repeated here.

The fourth embodiment of the present disclosure provides a display device. The display device employs the display device provided by the third embodiment. The display device, for instance, may be any product or component with display function, such as an LCD, e-paper, an OLED display, a mobile phone, a tablet PC, a TV, a display, a notebook computer, a digital picture frame or a navigator.

It should be noted that: when the display device is an LCD and a backlight unit (BLU) in the LCD is a side-lit BLU, the LCD can realize transparent display.

Figure 4:
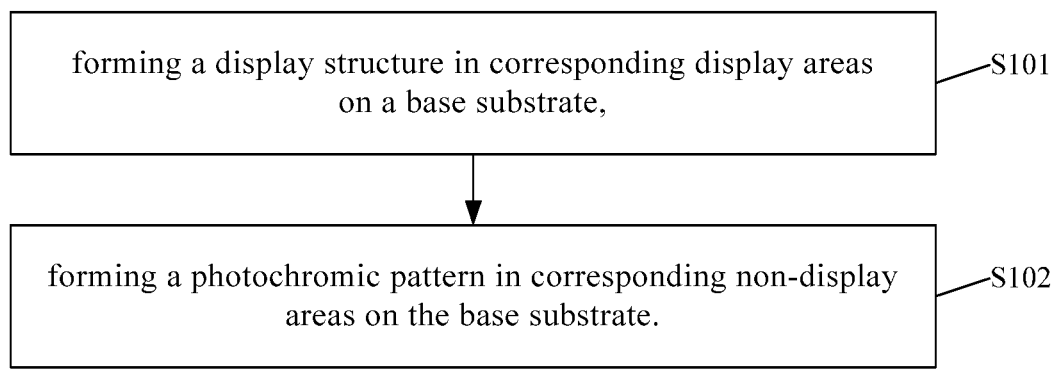
FIG. 4 is a flow chart of a method for manufacturing a display substrate, provided by a fifth embodiment of the present disclosure.

FIG. 4 is a flow chart of a method for manufacturing a display substrate, provided by the fifth embodiment of the present disclosure. As shown in FIG. 4, the display substrate is the display substrate in the first embodiment or the second embodiment. The method for manufacturing the display substrate comprises following operations.

S101: forming a display structure in corresponding display areas on a base substrate.

The display structure is used for displaying images.

S102: forming a photochromic pattern in corresponding non-display areas on the base substrate.

The photochromic pattern is used to adjust the light transmittance of the non-display areas according to the illumination intensity of received light.

Figure 5:
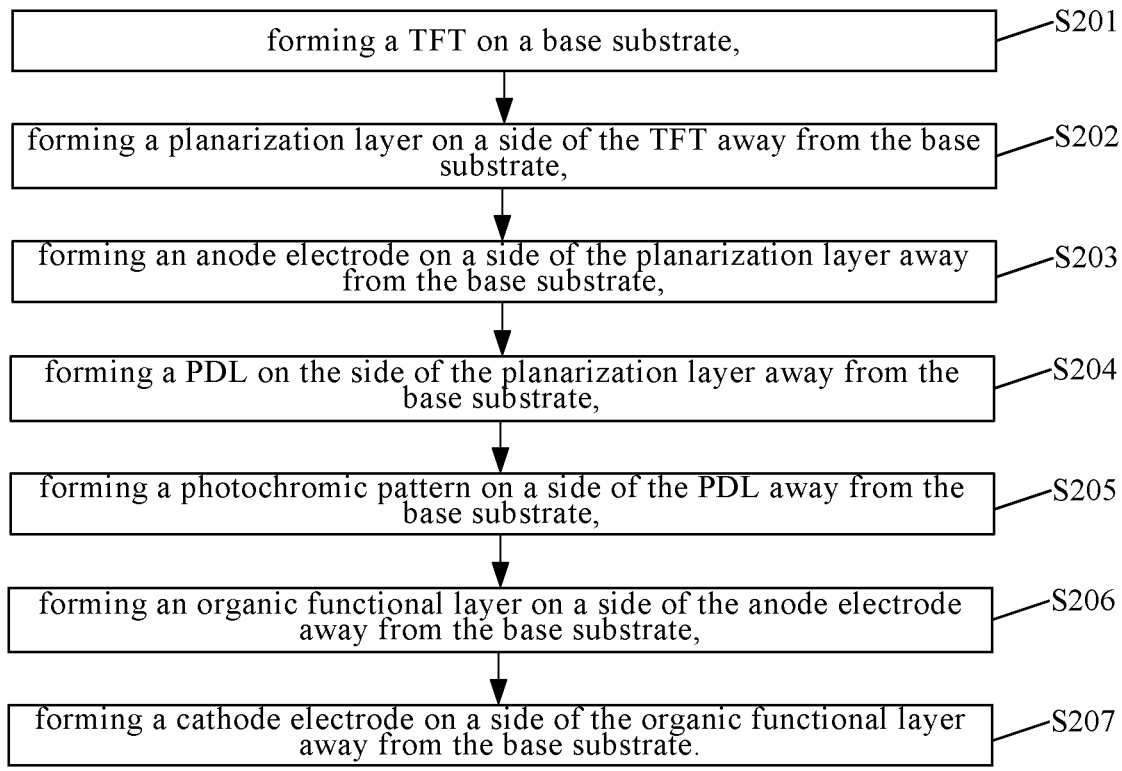
FIG. 5 is a flow chart of a method for manufacturing a display substrate, provided by a sixth embodiment of the present disclosure.

FIG. 5 is a flow chart of a method for manufacturing a display substrate, provided by the sixth embodiment of the present disclosure. FIGS. 6a to 6f are schematic diagrams illustrating the manufacturing processes of the manufacturing method as shown in FIG. 5. As shown in FIGS. 5 to 6f, the display substrate is the display substrate as shown in FIG. 1. The method for manufacturing the display substrate comprises following operations.

S201: forming a thin film transistor (TFT) on a base substrate.

Figure 6A:
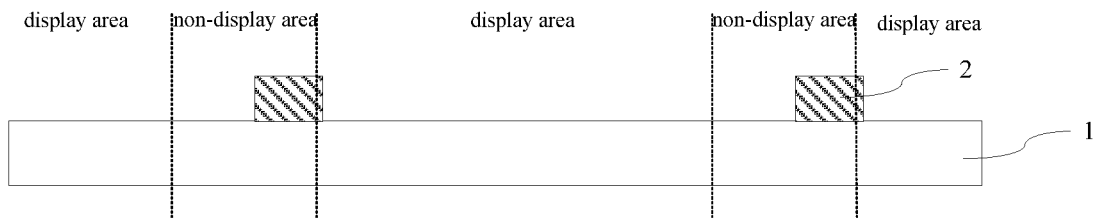
FIGS. 6a to 6f are schematic diagrams illustrating the manufacturing processes of the manufacturing method as shown in FIG. 5.

As shown in FIG. 6a, TFT 2 may be formed on a base substrate 1 by adoption of the conventional TFT manufacturing process. The TFT 2 may be an oxide TFT and a silicon-based TFT (an amorphous silicon TFT or a polysilicon TFT). In the embodiment, for instance, the TFT 2 is an oxide TFT. The oxide TFT has a high migration rate, rapid response speed and strong driving ability.

S202: forming a planarization layer on a side of the TFT away from the base substrate.

Figure 6B:
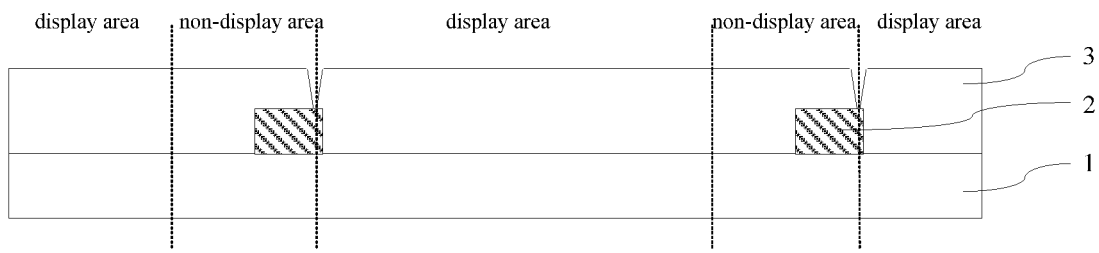

As shown in FIG. 6b, a planarization layer 3 arranged in the form of entire layer is formed on a side of the TFT 2 away from the base substrate 1, and a through hole is formed at a position corresponding to a drain electrode of the TFT 2.

S203: forming an anode electrode on a side of the planarization layer away from the base substrate.

Figure 6C:
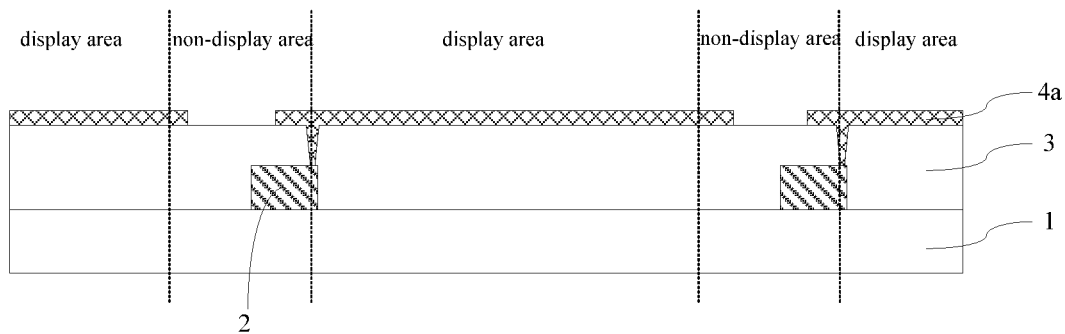

As shown in FIG. 6c, a pattern of anode electrode 4a is formed on the planarization layer 3 by a patterning process, and the anode electrode 4a is disposed in the display areas and connected with the drain electrode of the TFT 2 via the through hole. For instance, the material of the anode electrode 4a includes at least one of indium tin oxide (ITO), indium zinc oxide (IZO), zinc oxide (ZnO), indium gallium zinc oxide (IGZO), indium oxide, zinc aluminum oxide (ZAO) or graphene.

It should be noted that the patterning process in the embodiment of the present disclosure refers to a process including photoresist coating, exposure, development, etching, photoresist stripping, or the like.

S204: forming a PDL on a side of the planarization layer away from the base substrate.

Figure 6D:
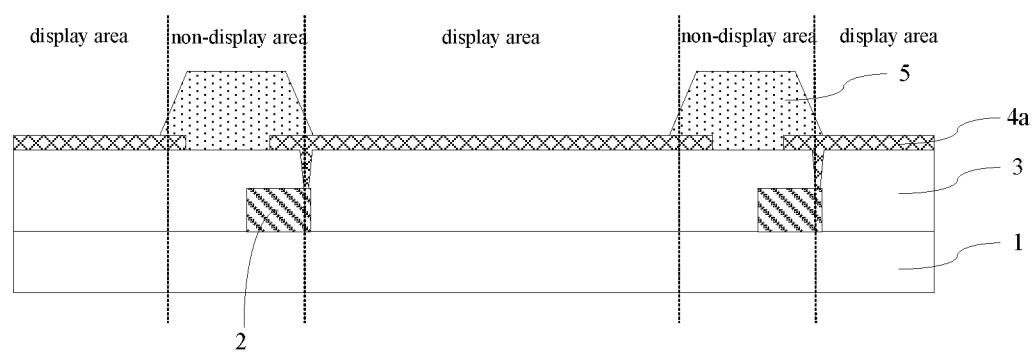

As shown in FIG. 6d, a pattern of the PDL 5 is formed by a patterning process, with the thickness range of 1-5 μm; and the PDL 5 is disposed in the non-display areas. For instance, the material of the PDL 5 is a photosensitive insulating organic resin, then, the pattern of the PDL 5 can be obtained by only adoption of the processes of exposure and development in the pattering process.

S205: forming a photochromic pattern on the side of the PDL away from the base substrate.

Figure 6E:
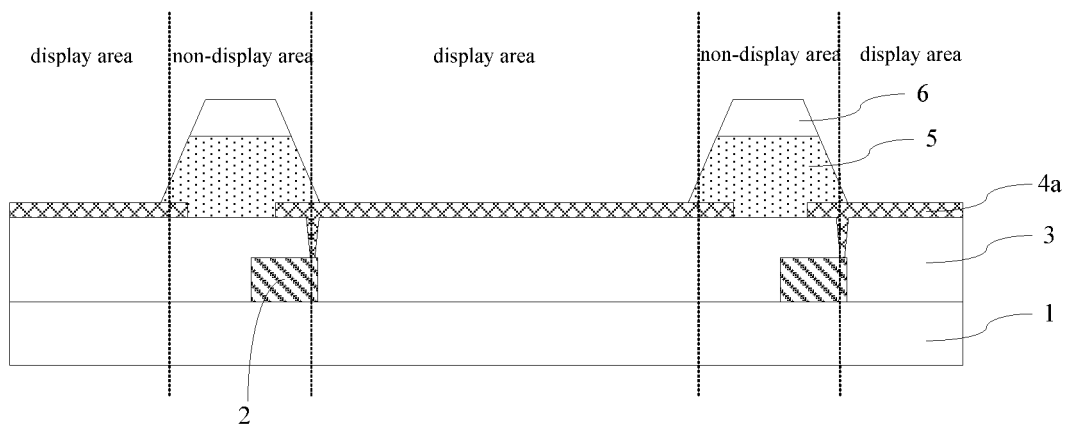
Figure 6F:
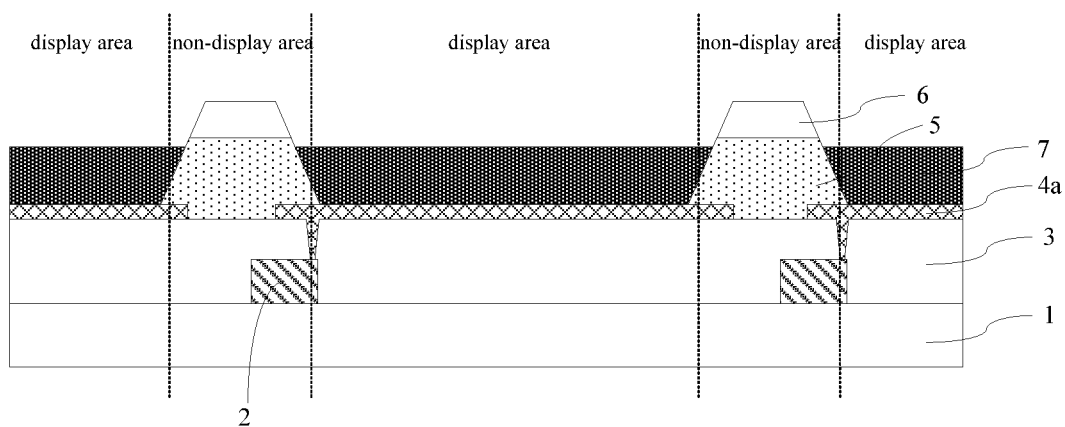

As shown in FIG. 6e, when the base material in the photochromic pattern 6 is silicon dioxide, the photochromic pattern 6 can be obtained by a process including photoresist coating, exposure, development, etching of a silicon dioxide film, photoresist stripping, or the like. When the base material in the photochromic pattern 6 is a photosensitive insulating organic resin, the photochromic pattern 6 can be obtained by only adoption of exposure and development processes.

It should be noted that the PDL 5 and the photochromic pattern 6 in the embodiment may be formed in a same patterning process. For instance, firstly, a pixel definition material film is formed on a side of the planarization layer 3 away from the base substrate 1; secondly, a photochromic material film is formed on a side of the pixel definition material film away from the base substrate 1; and finally, the PDL 5 and the photochromic pattern 6 are obtained by a single patterning process of the pixel definition material film and the photochromic material film. In this case, an orthographic projection of the photochromic pattern 6 on the PDL 5 just covers a surface of a side of the PDL 5 facing the photochromic pattern 6, namely the shape of the lower surface of the photochromic pattern 6 is the same as the shape of the upper surface of the PDL 5. In this case, the effect of the photochromic pattern 6 in adjusting the light transmittance of the non-display areas is optimum.

In addition, the PDL 5 and the photochromic pattern 6 are simultaneously formed by a single patterning process. In this way, no mask is required to be independently provided for the formation of the photochromic pattern 6, so the production cost is reduced.

S206: forming an organic functional layer on a side of the anode electrode away from the base substrate.

As shown in FIG. 6f, an organic functional layer 7 is disposed in the display area. The organic functional layer 7 at least includes an organic electroluminescent layer. In order to improve the luminous efficiency of the OLED, the organic functional layer 7 may also include layers, such as an HIL, an HTL, an EBL, a HBL, an ETL and an EIL.

S207: forming a cathode electrode on a side of the organic functional layer away from the base substrate.

As shown in FIG. 1 again, the cathode electrode 8 is formed on the organic functional layer 7. The material of the cathode electrode 8 may include at least one of low work function metallic materials, such as lithium, calcium, lithium fluoride, aluminum, silver and magnesium, or a transparent film formed by at least one of ITO, ZnO, IGZO or indium oxide.

It should be noted that the method for manufacturing the display substrate as shown in FIG. 3 includes the steps S201 to S203 (the anode electrode in the step S203 is replaced with pixel electrodes) and it also includes a step of forming an insulating layer on the pixel electrodes and a step of forming the photochromic pattern on the insulating layer.

Embodiments of the present disclosure provide a display substrate, a manufacturing method thereof, a display panel and a display device. The display substrate comprises: a plurality of display areas arranged in an array and non-display areas disposed among the display areas; a display structure is disposed in the display area and used for displaying images; the non-display area is light-transparent; and a photochromic pattern is disposed in the non-display areas and configured to adjust the light transmittance of the non-display areas according to the illumination intensity of received light. In the technical proposal of the present disclosure, the photochromic pattern is disposed in the non-display areas and can adjust the light transmittance of the non-display areas according to the illumination intensity of the received light, so the brightness of areas on a display image, where darker images are originally displayed, will not be increased due to the effect of ambient light. In this way, the contrast of the display image can be effectively guaranteed, and the display quality can be improved. Meanwhile, the brightness of the ambient light is significantly decreased after the light is filtered by the photochromic pattern in colored state, so the damage to the human eyes can be avoided.

It should be understood that the described above are only exemplary embodiments for explaining the principle of the present disclosure, and the present disclosure is not intended to be limited thereto. For one of ordinary skill in the art, variants and modifications may be made without departing from the spirit and principle of the present disclosure, and all of these variants and modifications shall fall within the scope of the present disclosure.

What is claimed is:

1. A display substrate, comprising: a base substrate, a plurality of display areas in an array on the base substrate, and non-display areas between the display areas, wherein a display structure is disposed in each display area and configured to display images;

a photochromic pattern is disposed in the non-display areas and configured to adjust a light transmittance of the non-display areas according to an illumination intensity of received light;

a pixel definition layer (PDL) is disposed in the non-display areas;

an orthographic projection of the photochromic pattern on the PDL covers only a surface of a side of the PDL facing the photochromic pattern; and wherein, when an external environment is dark and the display areas do not emit light, an illumination intensity of a surface of the photochromic pattern is low, and light of the external environment is not enough to excite a color change of the photochromic pattern, the photochromic pattern is transparent, and the light transmittance of the non-display areas is a maximum, or when the external environment is dark and the display areas emit dim light, the illumination intensity of the surface of the photochromic pattern is low, and the light of the external environment and the light produced by the display areas are not enough to excite the color change of the photochromic pattern, the photochromic pattern is transparent, and the light transmittance of the non-display areas is the maximum, or when the external environment is dark and the display areas emit bright light, the illumination intensity of the surface of the photochromic pattern is high, and the light of the external environment is not enough to excite the color change of the photochromic pattern, while the light produced by the display areas excites the color change of the photochromic pattern, the photochromic pattern is in a colored state; and along with an increase of luminance of the display areas, the light transmittance of the non-display areas is correspondingly reduced, or when the external environment is bright and the display areas do not emit light, the illumination intensity of the surface of the photochromic pattern is high, and the light of the external environment excites the color change of the photochromic pattern, the photochromic pattern is in the colored state, and along with an increase of a brightness of the external environment, the light transmittance of the non-display areas is correspondingly reduced, or when the external environment is bright and the display areas emit dim light, the illumination intensity of the surface of the photochromic pattern is high, and the light of the external environment excites the color change of the photochromic pattern, the photochromic pattern is in the colored state, and along with an increase of the brightness of the external environment, the light transmittance of the non-display areas is correspondingly reduced, or when the external environment is bright and the display areas emit bright light, the illumination intensity of the surface of the photochromic pattern is low, and both the light of the external environment and the light emitted from the display areas excite the color change of the photochromic pattern, the photochromic pattern is in the colored state, and along with an increase of the brightness of the external environment, the light transmittance of the non-display areas is correspondingly decreased.

2. The display substrate according to claim 1, wherein the display substrate is an organic light-emitting diode (OLED) display substrate; the display structure comprises an OLED; and the OLED comprises: an anode electrode, a cathode electrode, and an organic functional layer disposed between the anode electrode and the cathode electrode.

3. The display substrate according to claim 1, wherein the PDL defines the display areas; and the photochromic pattern is on a side of the PDL away from the base substrate.

4. The display substrate according to claim 1, wherein the display substrate is a liquid crystal display (LCD) substrate; and the display structure comprises a pixel electrode.

5. The display substrate according to claim 1, wherein a material of the photochromic pattern comprises at least one of silver halide, zinc halide, cadmium halide, copper halide, magnesium halide, spiropyran, phenoxazine dye, diarylethene derivatives, dehydropyridine, furazolidic anhydride derivatives, or azobenzene derivatives.

6. A display panel, comprising a display substrate, wherein the display substrate comprises:

a base substrate, a plurality of display areas in an array on the base substrate, and non-display areas between the display areas, wherein a display structure is disposed in each display area and configured to display images;

a photochromic pattern is disposed in the non-display areas and configured to adjust a light transmittance of the non-display areas according to an illumination intensity of received light;

a pixel definition layer (PDL) is disposed in the non-display areas;

an orthographic projection of the photochromic pattern on the PDL covers only a surface of a side of the PDL facing the photochromic pattern; and wherein, when an external environment is dark and the display areas do not emit light, an illumination intensity of a surface of the photochromic pattern is low, and light of the external environment is not enough to excite a color change of the photochromic pattern, the photochromic pattern is transparent, and the light transmittance of the non-display areas is a maximum, or when the external environment is dark and the display areas emit dim light, the illumination intensity of the surface of the photochromic pattern is low, and the light of the external environment and the light produced by the display areas are not enough to excite the color change of the photochromic pattern, the photochromic pattern is transparent, and the light transmittance of the non-display areas is the maximum, or when the external environment is dark and the display areas emit bright light, the illumination intensity of the surface of the photochromic pattern is high, and the light of the external environment is not enough to excite the color change of the photochromic pattern, while the light produced by the display areas excites the color change of the photochromic pattern, the photochromic pattern is in a colored state; and along with an increase of luminance of the display areas, the light transmittance of the non-display areas is correspondingly reduced, or when the external environment is bright and the display areas do not emit light, the illumination intensity of the surface of the photochromic pattern is high, and the light of the external environment excites the color change of the photochromic pattern, the photochromic pattern is in the colored state, and along with an increase of a brightness of the external environment, the light transmittance of the non-display areas is correspondingly reduced, or when the external environment is bright and the display areas emit dim light, the illumination intensity of the surface of the photochromic pattern is high, and the light of the external environment excites the color change of the photochromic pattern, the photochromic pattern is in the colored state, and along with an increase of the brightness of the external environment, the light transmittance of the non-display areas is correspondingly reduced, or when the external environment is bright and the display areas emit bright light, the illumination intensity of the surface of the photochromic pattern is low, and both the light of the external environment and the light emitted from the display areas excite the color change of the photochromic pattern, the photochromic pattern is in the colored state, and along with an increase of the brightness of the external environment, the light transmittance of the non-display areas is correspondingly decreased.

7. A display device, comprising the display panel according to claim 6.

8. A method for manufacturing a display substrate, wherein the display substrate comprises: a plurality of display areas in an array and non-display areas between the display areas; and the method for manufacturing the display substrate comprises:

forming a display structure in corresponding display areas on a base substrate, in which the display structure is used for image display; and forming a photochromic pattern in corresponding non-display areas on the base substrate, in which the photochromic pattern is configured to adjust a light transmittance of the non-display areas according to an illumination intensity of received light, wherein a pixel definition layer (PDL) is disposed in the non-display areas;

wherein an orthographic projection of the photochromic pattern on the PDL covers only a surface of a side of the PDL facing the photochromic pattern; and wherein, when an external environment is dark and the display areas do not emit light, an illumination intensity of a surface of the photochromic pattern is low, and light of the external environment is not enough to excite a color change of the photochromic pattern, the photochromic pattern is transparent, and the light transmittance of the non-display areas is a maximum, or when the external environment is dark and the display areas emit dim light, the illumination intensity of the surface of the photochromic pattern is low, and the light of the external environment and the light produced by the display areas are not enough to excite the color change of the photochromic pattern, the photochromic pattern is transparent, and the light transmittance of the non-display areas is the maximum, or when the external environment is dark and the display areas emit bright light, the illumination intensity of the surface of the photochromic pattern is high, and the light of the external environment is not enough to excite the color change of the photochromic pattern, while the light produced by the display areas excites the color change of the photochromic pattern, the photochromic pattern is in a colored state; and along with an increase of luminance of the display areas, the light transmittance of the non-display areas is correspondingly reduced, or when the external environment is bright and the display areas do not emit light, the illumination intensity of the surface of the photochromic pattern is high, and the light of the external environment excites the color change of the photochromic pattern, the photochromic pattern is in the colored state, and along with an increase of a brightness of the external environment, the light transmittance of the non-display areas is correspondingly reduced, or when the external environment is bright and the display areas emit dim light, the illumination intensity of the surface of the photochromic pattern is high, and the light of the external environment excites the color change of the photochromic pattern, the photochromic pattern is in the colored state, and along with an increase of the brightness of the external environment, the light transmittance of the non-display areas is correspondingly reduced, or when the external environment is bright and the display areas emit bright light, the illumination intensity of the surface of the photochromic pattern is low, and both the light of the external environment and the light emitted from the display areas excite the color change of the photochromic pattern, the photochromic pattern is in the colored state, and along with an increase of the brightness of the external environment, the light transmittance of the non-display areas is correspondingly decreased.

9. The method for manufacturing the display substrate according to claim 8, wherein the display substrate is an OLED display substrate; and the forming the display structure and the forming the photochromic pattern comprises:
   forming a thin-film transistors (TFT) on the base substrate;
   forming a planarization layer on a side of the TFT away from the base substrate;
   forming an anode electrode on a side of the planarization layer away from the base substrate, in which the anode electrode is connected with a drain electrode of the TFT via a through hole;
   forming the PDL on the side of the planarization layer away from the base substrate, in which the PDL is in the non-display areas and configured to define the display areas;
   forming the photochromic pattern on a side of the PDL away from the base substrate;
   forming an organic functional layer on a side of the anode electrode away from the base substrate, in which the organic functional layer is disposed in the display areas; and
   forming a cathode electrode on a side of the organic functional layer away from the base substrate.

10. The method for manufacturing the display substrate according to claim 9, wherein the forming the PDL and the forming the photochromic pattern comprises:
   forming a pixel definition material film on a side of the planarization layer away from the base substrate;
   forming a photochromic material film on a side of the pixel definition material film away from the base substrate; and
   patterning the pixel definition material film and the photochromic material film to obtain the PDL and the photochromic pattern.

11. The display substrate according to claim 2, wherein the PDL defines the display areas; and the photochromic pattern is on a side of the PDL away from the base substrate.

12. The display panel according to claim 6, wherein the display substrate is an organic light-emitting diode (OLED) display substrate; the display structure comprises an OLED; and
   the OLED comprises: an anode electrode, a cathode electrode, and an organic functional layer disposed between the anode electrode and the cathode electrode.

13. The display panel according to claim 6, wherein the PDL defines the display areas; and the photochromic pattern is on a side of the PDL away from the base substrate.

14. The display panel according to claim 6, wherein the display substrate is a liquid crystal display (LCD) substrate; and the display structure comprises a pixel electrode.

15. The display panel according to claim 6, wherein a material of the photochromic pattern comprises at least one of silver halide, zinc halide, cadmium halide, copper halide, magnesium halide, spiropyran, phenoxazine dye, diarylethene derivatives, dehydropyridine, furazolidic anhydride derivatives, or azobenzene derivatives.

* * * * *